US007373116B2

(12) United States Patent
Rofougaran et al.

(10) Patent No.: US 7,373,116 B2
(45) Date of Patent: May 13, 2008

(54) HIGH OUTPUT POWER RADIO FREQUENCY INTEGRATED CIRCUIT

(75) Inventors: Ahmadreza (Reza) Rofougaran, Newport Coast, CA (US); Shahla Khorram, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 145 days.

(21) Appl. No.: 11/475,530

(22) Filed: Jun. 26, 2006

(65) Prior Publication Data

US 2006/0246859 A1    Nov. 2, 2006

Related U.S. Application Data

(60) Division of application No. 10/305,646, filed on Nov. 27, 2002, now Pat. No. 7,092,681, which is a continuation-in-part of application No. 10/200,959, filed on Jul. 23, 2002, now Pat. No. 6,996,379.

(51) Int. Cl.
 *H04B 1/02*    (2006.01)
(52) U.S. Cl. .................. 455/91; 455/114.3; 455/95; 330/127
(58) Field of Classification Search ............ 455/95, 455/91, 73, 84–85, 86–87, 209, 211, 255, 455/258, 293, 311, 312, 326; 330/127
See application file for complete search history.

(56) References Cited

U.S. PATENT DOCUMENTS

| 6,856,796 B2 * | 2/2005 | Ding et al. ................. 455/295 |
| 6,859,646 B2 * | 2/2005 | Khorram ................. 455/234.1 |
| 7,015,755 B2 * | 3/2006 | Pettersson et al. .......... 330/254 |

\* cited by examiner

*Primary Examiner*—Tony T. Nguyen
(74) *Attorney, Agent, or Firm*—Garlick Harrison & Markison; Timothy W. Markison

(57) ABSTRACT

A high output power radio frequency integrated circuit (RFIC) includes an up-conversion module, a plurality of power amplifier input stages, and a plurality of integrated circuit pads. The up-conversion module is coupled to convert a low intermediate frequency (IF) signal into a radio frequency (RF) signal. The plurality of power amplifier input stages is coupled to receive the RF signal and to produce separate RF pre-amp signals. Each of the plurality of integrated circuit pads is coupled to a corresponding one of the plurality of power amplifier input stages and to provide the separate RF pre-amp signals external to the RFIC.

8 Claims, 6 Drawing Sheets high-powered transmitter 100 high-powered transmitter 100 high-powered transmitter 130

PA input and output stages high-powered transmitter 150

HIGH OUTPUT POWER RADIO FREQUENCY INTEGRATED CIRCUIT

This patent application is claiming priority under 35 USC § 121 as a divisional patent application of patent application entitled HIGH OUTPUT POWER RADIO FREQUENCY INTEGRATED CIRCUIT, having a filing date of Nov. 27, 2002, and a Ser. No. of 10/305,646, now U.S. Pat. No. 7,092,681 and is a continuation in part of patent application entitled LINEAR HIGH POWERED INTEGRATED CIRCUIT TRANSMITTER, having a filing date of Jul. 23, 2002, and having a Ser. No. of 10/200,959 now U.S. Pat. No. 6,996,379.

BACKGROUND OF THE INVENTION

1. Technical Field of the Invention

This invention relates generally to communication systems and more particularly to radio transmitters used within such systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

As an example, an integrated circuit transmitter implemented utilizing 0.18μ CMOS technology, the maximum output power of a power amplifier is approximately 7 dBm (dBm=10 log(power in miliwatts). While this limited output power range is acceptable for some applications, it is not acceptable for many of the newer radio applications (such as IEEE 802.11a, b, Bluetooth, et cetera) that require as much as 20 dBm of output power from the transmitter.

One solution to provide a greater output power is to use higher performance integrated circuit process such as gallium arsenide or silicon germanium. While these processes improve the output power, they are significantly more expensive and thus limit their applicability to produce in high-end communication equipment. Another solution, which is more popular, is to use an off-chip power amplifier. This solution provides greater power, but requires additional integrated circuits and/or discrete components to implement the power amplifier.

Therefore, a need exists for a CMOS based on-chip power amplifier solution that provides a linear output response and that provides output power greater than 7 dBm.

BRIEF SUMMARY OF THE INVENTION

The high output power radio frequency integrated circuit of the present invention substantially meets these needs and others. An embodiment of a high output power radio frequency integrated circuit includes an up conversion module, a plurality of drivers and a plurality of integrated circuit pads. The up conversion module is operably coupled to convert a low intermediate frequency (IF) signal into a radio frequency (RF) signal. The plurality of drivers are operably coupled to receive the RF signal and to produce separate RF drive signals therefrom. The plurality of integrated circuit pads are coupled to the plurality of drivers to provide the separate RF drive signals to external components of the RFIC. Accordingly, the RFIC provides greater output power than is currently available from CMOS based on-chip power amplifiers.

An alternate embodiment of a high output power radio frequency integrated circuit includes an up conversion module, a plurality of power amplifier input stages, and a plurality of integrated circuit pads. The up conversion module converts a low intermediate frequency (IF) signal into a radio frequency (RF) signal. The plurality of power amplifier input stages are operably coupled to receive the RF signal and to produce separate radio frequency pre-amplified signals. The plurality of integrated circuit pads are coupled to the plurality of power amplifier input stages to provide the separate RF pre-amp signals external to the RFIC. Accordingly, the RFIC provides greater output power than is currently available from CMOS based on-chip power amplifiers.

Another embodiment of a high output power radio frequency integrated circuit includes an up conversion module, a plurality of power amplifiers and a plurality of integrated circuit pads. The up conversion module is operably coupled to convert a low intermediate frequency signal into a radio frequency signal. The plurality of power amplifiers are operably coupled to receive the RF signal and to produce separate outbound RF signals. The plurality of integrated circuit pads is coupled to the plurality of power amplifiers to provide the separate outbound RF signals external to the RFIC. Accordingly, the RFIC provides greater output power than is currently available from CMOS based on-chip power amplifiers.

DETAILED DESCRIPTION OF THE INVENTION

Figure 1:
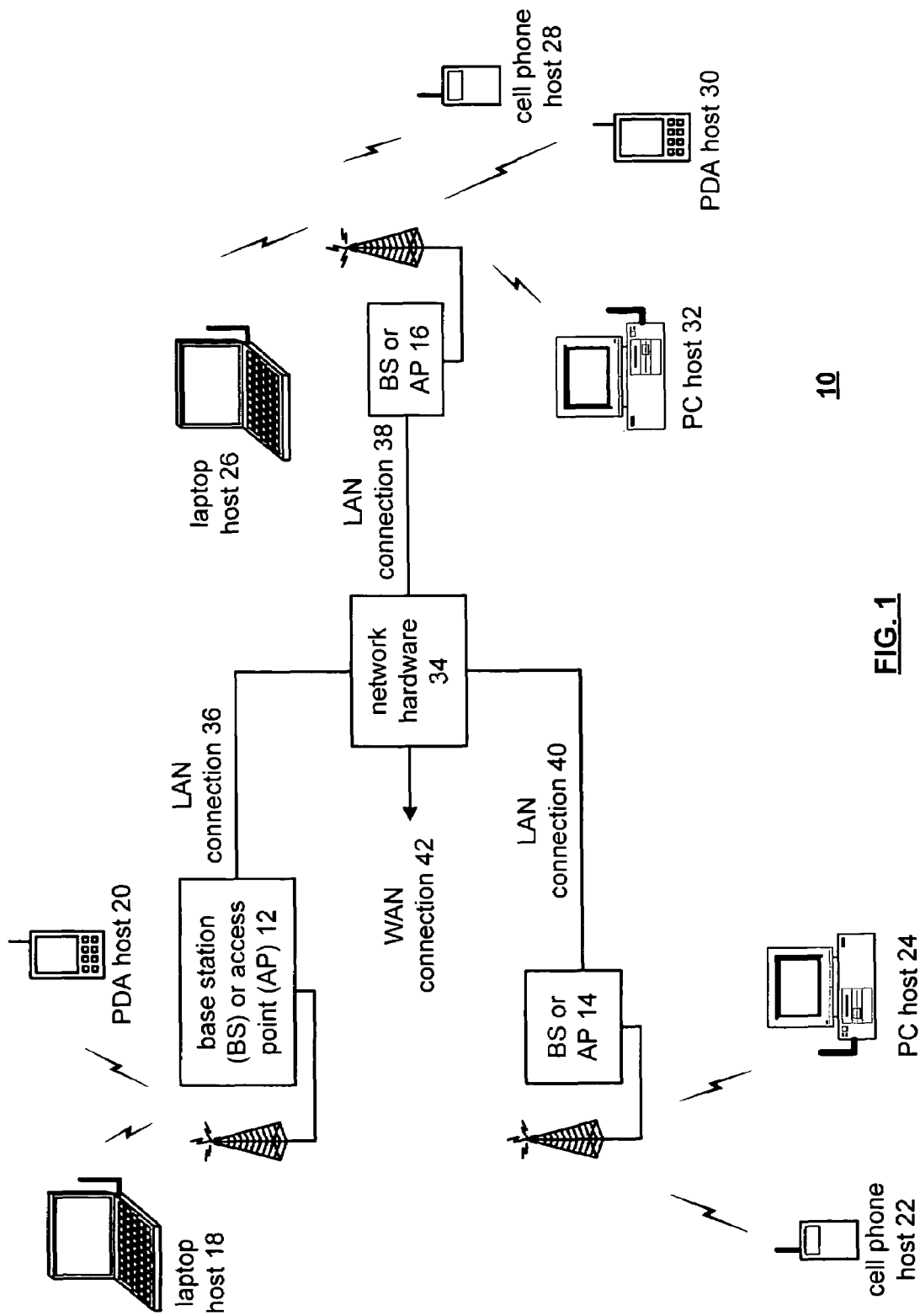
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Figure 2:
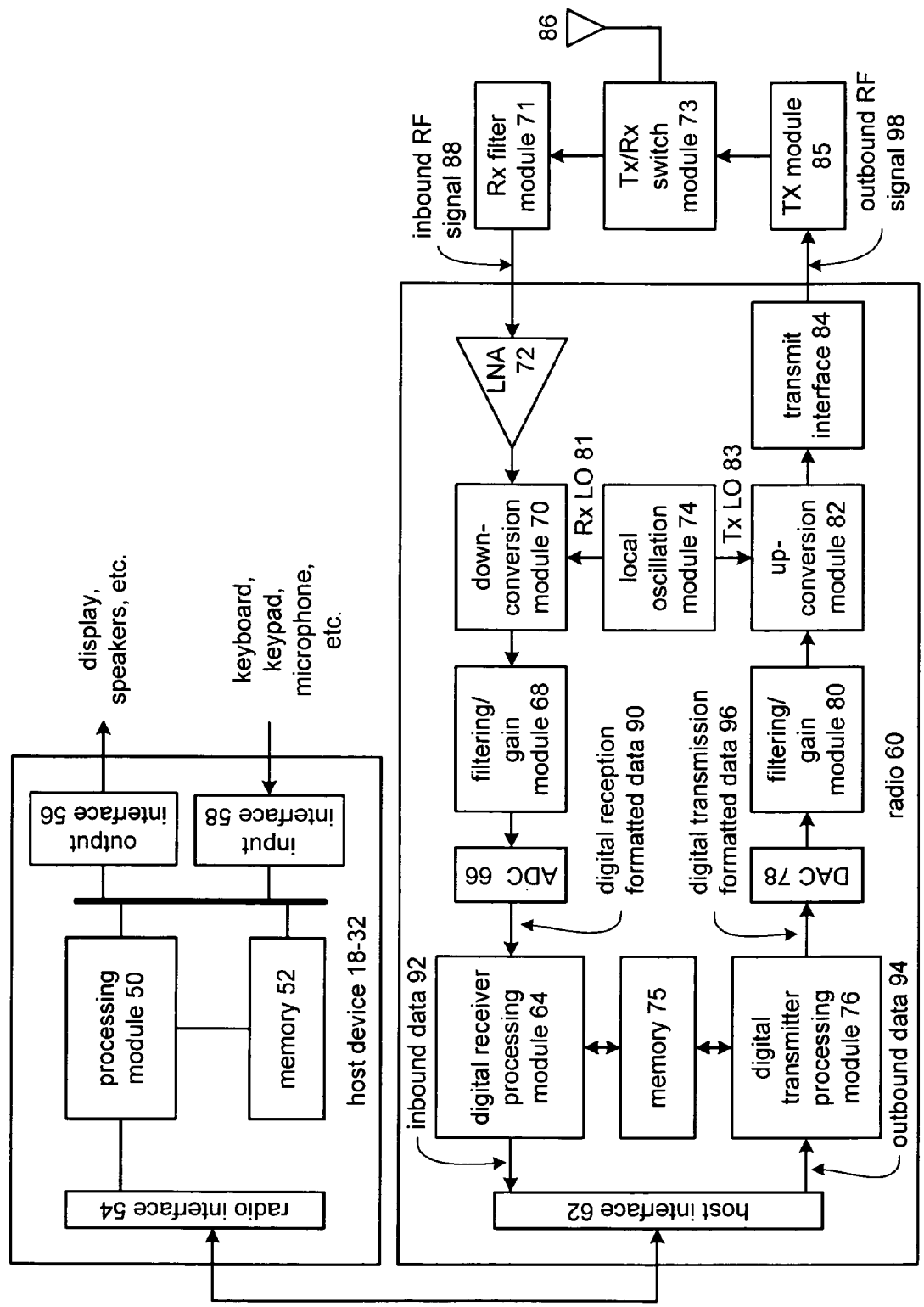
FIG. 2 is a schematic block diagram of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71 (on or off chip), a low noise amplifier 72, a transmitter/receiver switch 73 (on or off chip), a local oscillation module 74, memory 75, a digital transmitter processing module 76, a digital-to-analog converter 78, a filtering/gain module 80, an IF mixing up conversion stage 82, a transmit interface 84, a transmitter filter module 85 (on or off chip), and an antenna 86. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The transmit interface 84, which may be implemented in accordance with the present invention, at least partially amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 73, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/gain module 68. The filtering/gain module 68 filters and/or gains the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
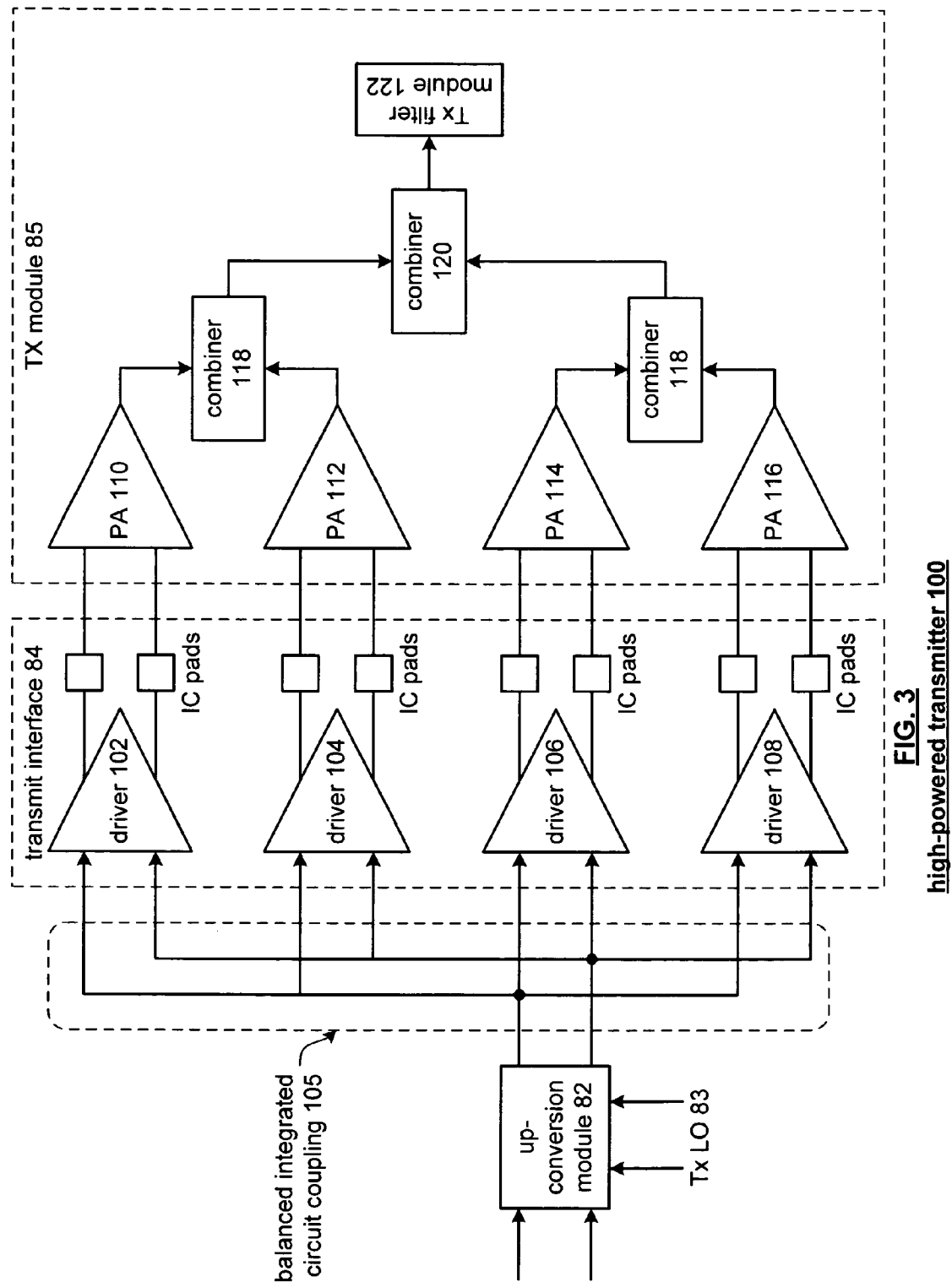
FIG. 3 is a schematic block diagram of a high powered transmitter in accordance with the present invention.

FIG. 3 is a schematic block diagram of a high powered transmitter section 100 that includes the up conversion module 82, balanced integrated circuit coupling 105, the transmit interface 84 (which is on chip), and the transmit module 85 (which is off chip). The up conversion module 82, based on the transmit local oscillation 83, up converts a low intermediate frequency signal, (i.e., a signal having a carrier frequency of a few kilohertz to a few megahertz) into a radio frequency signal. The radio frequency signal is provided, via the balanced integrated circuit coupling 105 to a plurality of drivers 102-108 of the transmit interface 84. The balanced integrated circuit coupling 105, at frequencies of the RF signal, has similar impedances between the up conversion module 82 and each of the drivers 102-108. The output of the drivers is coupled to corresponding integrated circuit (IC) pads.

The externally coupled transmit module 85 includes a plurality of power amplifiers 110-116, a plurality of combining modules 118-120 and a transmit filter module 122. Each power amplifier is coupled to amplify a signal received via a corresponding one of the drivers 102-108. Outputs of power amplifiers 110 and 112 are combined via combiner 118. The outputs of power amplifiers 114 and 116 are combined via combiner 119. The separate combinations of the outputs of power amplifiers 110 and 112 and the combination of outputs of power amplifiers 114-116 double the individual power of each of these thus providing a 3 dB increase in power. When the outputs of combiners 118 and 119 are combined via combiner 120, the corresponding output power of a single power amplifier is increased by 6 dB. The transmit filter module 122, which may be a bandpass filter centered at the frequency of the RF signal provides the combined signal to the antenna.

Figure 4:
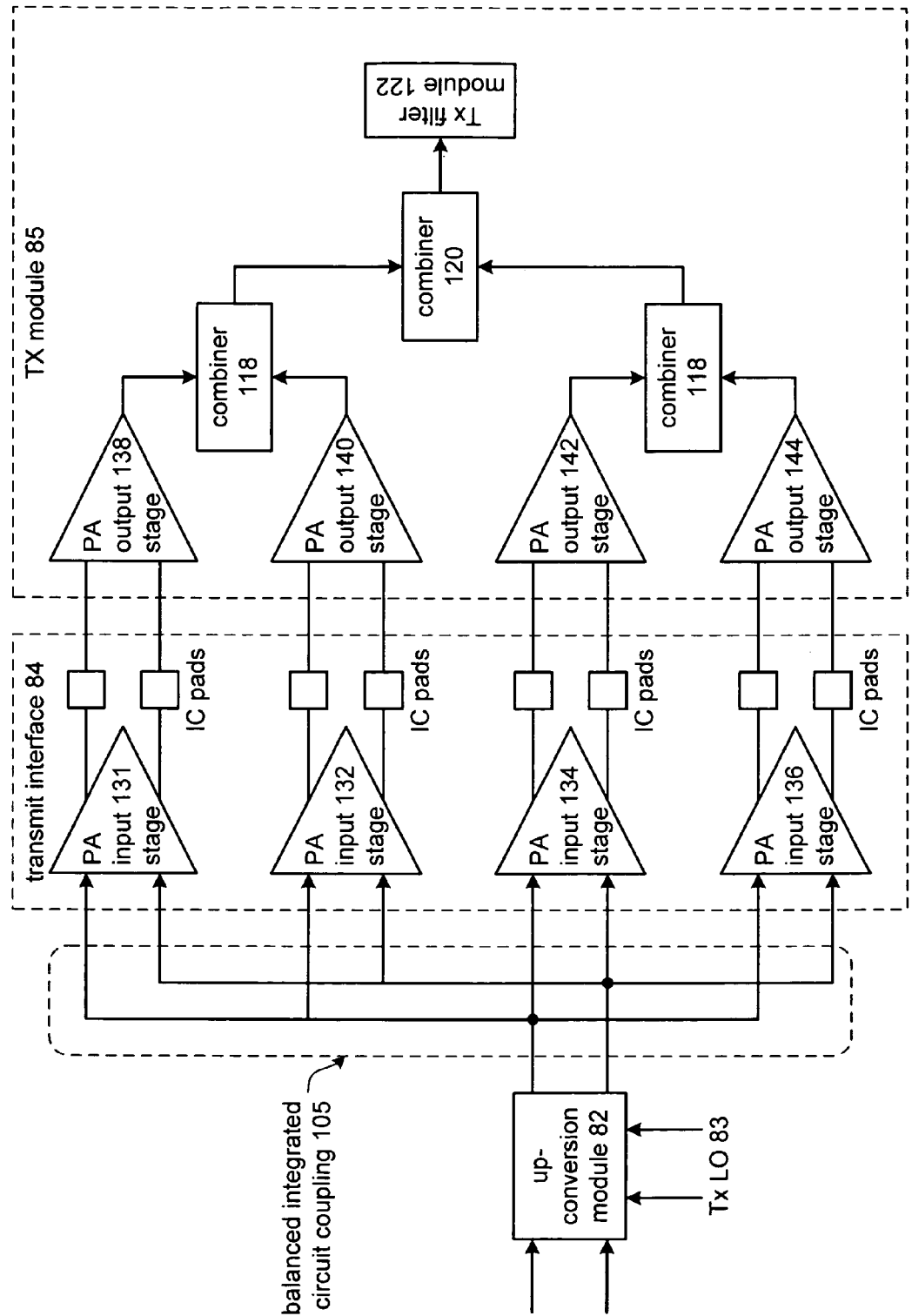
FIG. 4 is a schematic block diagram of an alternate high powered transmitter in accordance with the present invention.

FIG. 4 is a schematic block diagram of an alternate high powered transmitter 130. The high powered transmitter 130 includes on-chip, the up conversion module 82, the balanced integrated circuit coupling 105 and the transmitter interface 84. The transmit module 85 is external to the RFIC.

The transmit interface 84 includes a plurality of power amplifier input stages 131-136. Each power amplifier input stage 132-136 provides signals externally to corresponding power amplifier output stages 138-144. The outputs of the power amplifier stages 138-144 are combined via combiners 118, 119 and 120 to produce a composite RF signal. The transmit filter module 122 filters the signal and provides it to the antenna.

Figure 5:
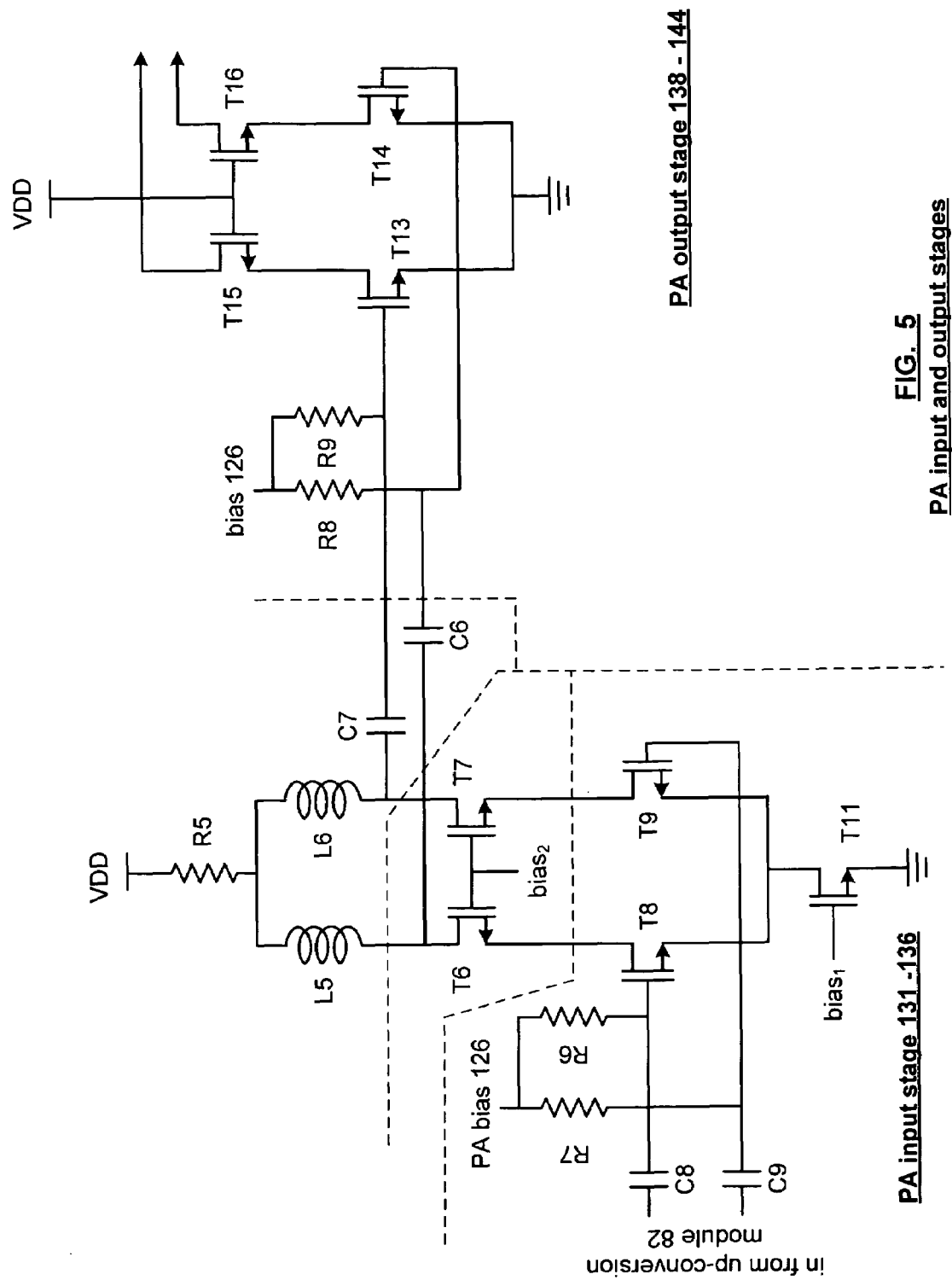
FIG. 5 is a schematic block diagram of the input and output stages of power amplifiers in accordance with the present invention.

FIG. 5 is a schematic block diagram of the power amplifier input stage and power amplifier output stage of the high powered transmitter 130 of FIG. 4. The partitioning between the power amplifier input stage 131-136 and power amplifier output stage 138-144 may be done in a variety of ways as indicated by the dash lines. As a whole, the power amplifier includes input differential transistors T8 and T9 that receive, via AC coupling capacitors C8 and C9, the output of up conversion module 82. Transistor T11 functions as a current source for input transistors T8 and T9, while transistors T6 and T7 function in combination with inductors L5 and L6 as loads for the input transistors T8 and T9. Capacitors C6 and C7 couple the output of the input stage to the power amplifier output stage. The output stage includes input transistors T13 and T14 and output drive transistors T15 and T16.

Figure 6:
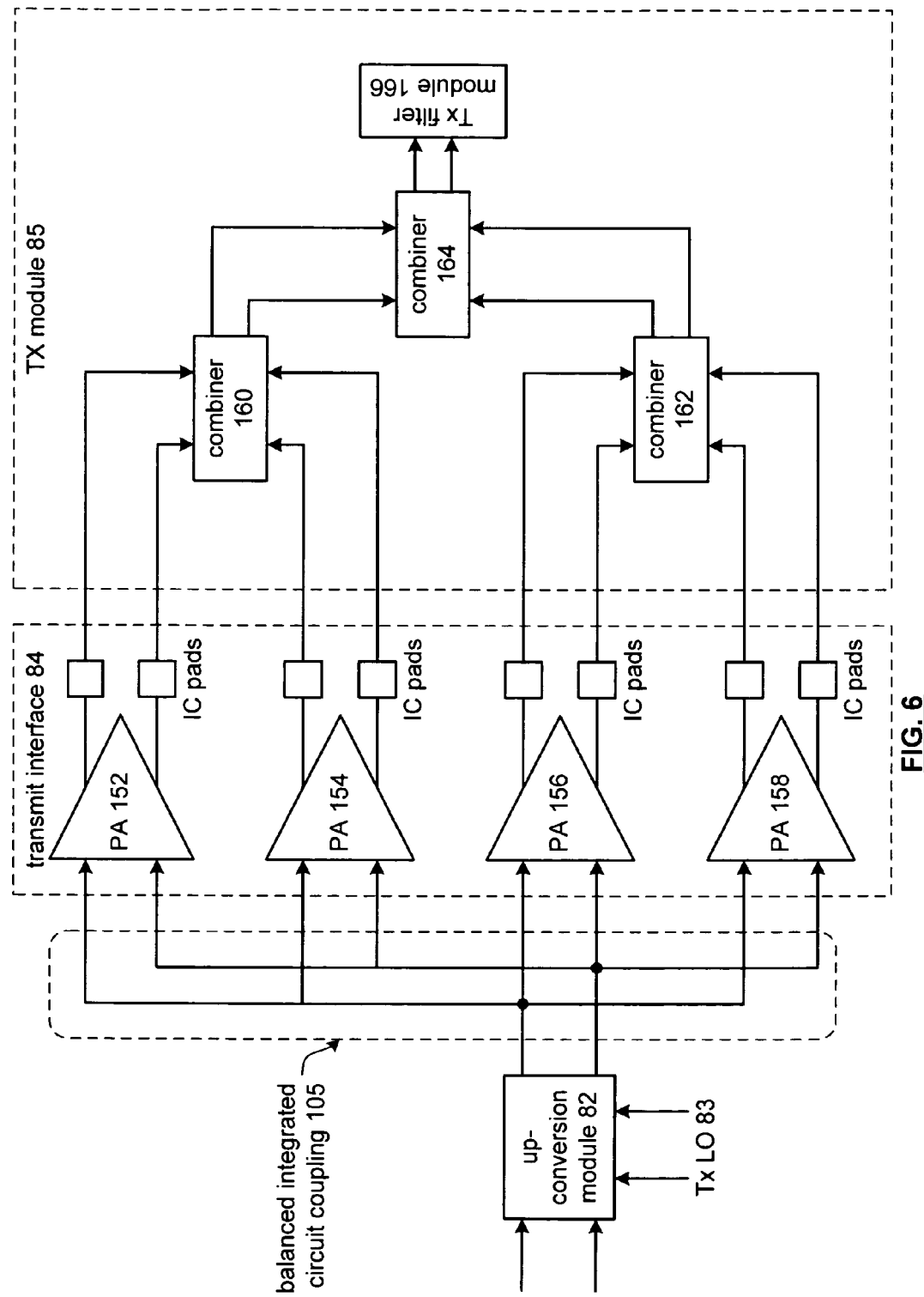
FIG. 6 is a schematic block diagram of another embodiment of a high powered transmitter in accordance with the present invention.

FIG. 6 is a schematic block diagram of another embodiment of a high powered transmitter 150. The high powered transmitter 150 includes, on-chip, the up conversion module 82, the balanced integrated circuit coupling 105, and the transmitter interface 84. External to the radio frequency integrated circuit is the transmit module 85. In this embodiment, the transmit interface 84 includes a plurality of power amplifiers 152-158. The transmit module 85 includes a plurality of combiners 160-164 which produce a composite signal that is filtered by transmit filter module 166. The combining modules 160-164, and combining modules 118-120, may be of conventional design as known to one of average skill in the art.

The preceding discussion has presented a high output power radio frequency integrated circuit that provides output transmit powers greater than conventionally obtained via CMOS radio frequency integrated circuits. As one of average skill in the art will appreciate, other embodiments may be derived from the teaching of the present invention, without deviating from the scope of the claims.

What is claimed is:

1. A high output power radio frequency integrated circuit (RFIC) comprises:
    up-conversion module operably coupled to convert a low intermediate frequency (IF) signal into a radio frequency (RF) signal;
    a plurality of power amplifier input stages operably coupled to receive the RF signal and to produce separate RF pre-amp signals; and
    a plurality of integrated circuit pads, wherein each of the plurality of integrated circuit pads is coupled to a corresponding one of the plurality of power amplifier input stages and to provide the separate RF pre-amp signals external to the RFIC.

2. The high output power RFIC of claim 1 further comprises:
    balanced integrated circuit coupling that couples the plurality of driver to the up-conversion module and to the plurality of IC pads.

3. The high output power RFIC of claim 1, wherein each of the plurality of power amplifier input stages further comprises:
    a pair of input transistors operably coupled to receive the RF signal as a differential signal; and
    a current source operably coupled to sources of the pair of input transistors.

4. The high output power RFIC of claim 3, wherein each of the plurality of power amplifier input stages further comprises:
    load circuit operably coupled to drains of the pair of input transistors, wherein the coupling of the load circuit to the pair of input transistors provides an output of the each of the plurality of power amplifier input stages.

5. The high output power RFIC of claim 3, wherein each of the plurality of power amplifier input stages further comprises:
    AC coupling circuit operably coupled to gates of the pair of input transistors.

6. A high output power radio frequency integrated circuit (RFIC) comprises:
    up-conversion module operably coupled to convert a low intermediate frequency (IF) signal into a radio frequency (RF) signal;
    a plurality of power amplifier operably coupled to receive the RF signal and to produce separate outbound RF signals; and
    a plurality of integrated circuit pads, wherein each of the plurality of integrated circuit pads is coupled to a corresponding one of the plurality of power amplifiers and to provide the separate outbound RF signals external to the RFIC.

7. The high output power RFIC of claim 6 further comprises:
    balanced integrated circuit coupling that couples the plurality of driver to the up-conversion module and to the plurality of IC pads.

8. The high output power RFIC of claim 6, wherein each of the plurality of power amplifiers further comprises:
    an input section operably coupled to receive the RF signal; and
    an output section operably coupled to provide a corresponding one of the separate outbound RF signals.

* * * * *